(12) United States Patent
Lin et al.

(10) Patent No.: US 12,094,729 B2
(45) Date of Patent: Sep. 17, 2024

(54) SEMICONDUCTOR DEVICE WITH ENCAPSULANT DEPOSITED ALONG SIDES AND SURFACE EDGE OF SEMICONDUCTOR DIE IN EMBEDDED WLCSP

(71) Applicant: STATS ChipPAC Pte. Ltd., Singapore (SG)

(72) Inventors: Yaojian Lin, Singapore (SG); Heinz-Peter Wirtz, Dottingen (CH); Seung Wook Yoon, Singapore (SG); Pandi C. Marimuthu, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 233 days.

(21) Appl. No.: 17/457,719

(22) Filed: Dec. 6, 2021

(65) Prior Publication Data

US 2022/0093417 A1      Mar. 24, 2022

Related U.S. Application Data

(60) Continuation of application No. 16/687,865, filed on Nov. 19, 2019, now Pat. No. 11,222,793, which is a
(Continued)

(51) Int. Cl.
*H01L 23/28*      (2006.01)
*H01L 21/3105*      (2006.01)
(Continued)

(52) U.S. Cl.
CPC ...... *H01L 21/565* (2013.01); *H01L 21/31058* (2013.01); *H01L 21/56* (2013.01);
(Continued)

(58) Field of Classification Search
CPC ............ H01L 21/565; H01L 21/31058; H01L 21/561; H01L 21/563; H01L 24/11;
(Continued)

(56) References Cited

U.S. PATENT DOCUMENTS 5,148,266 A    9/1992  Khandros et al.
5,266,528 A    11/1993 Yamada
(Continued)

FOREIGN PATENT DOCUMENTS

CN    101521165 A    9/2009
CN    101944518 A    1/2011
(Continued)

OTHER PUBLICATIONS

Yoon, Seung Wook, "Integrated 3D Wafer Level Packaging Solutions for Mobile Applications", SEMICON Singapore, pp. 1-25, May 2013.

*Primary Examiner* — Shahed Ahmed
(74) *Attorney, Agent, or Firm* — Brian M. Kaufman; Robert D. Atkins; PATENT LAW GROUP: Atkins and Associates, P.C.

(57) ABSTRACT

A semiconductor device has a semiconductor wafer including a plurality of semiconductor die. An insulating layer is formed over the semiconductor wafer. A portion of the insulating layer is removed by LDA to expose a portion of an active surface of the semiconductor die. A first conductive layer is formed over a contact pad on the active surface of the semiconductor die. The semiconductor wafer is singulated to separate the semiconductor die. The semiconductor die is disposed over a carrier with the active surface of the semiconductor die offset from the carrier. An encapsulant is deposited over the semiconductor die and carrier to cover a side of the semiconductor die and the exposed portion of the active surface. An interconnect structure is formed over the first conductive layer. Alternatively, a MUF material is
(Continued)

deposited over a side of the semiconductor die and the exposed portion of the active surface.

22 Claims, 14 Drawing Sheets

Related U.S. Application Data division of application No. 15/274,590, filed on Sep. 23, 2016, now Pat. No. 10,515,828, which is a continuation of application No. 13/832,809, filed on Mar. 15, 2013, now Pat. No. 9,496,195.

(60) Provisional application No. 61/744,699, filed on Oct. 2, 2012.

(51) Int. Cl.
*H01L 21/56* (2006.01)
*H01L 21/78* (2006.01)
*H01L 23/00* (2006.01)
*H01L 23/31* (2006.01)

(52) U.S. Cl.
CPC .......... *H01L 21/561* (2013.01); *H01L 21/563* (2013.01); *H01L 21/78* (2013.01); *H01L 23/28* (2013.01); *H01L 23/3114* (2013.01); *H01L 23/3121* (2013.01); *H01L 23/3128* (2013.01); *H01L 23/3135* (2013.01); *H01L 23/3142* (2013.01); *H01L 24/11* (2013.01); *H01L 24/81* (2013.01); *H01L 24/96* (2013.01); *H01L 24/97* (2013.01); *H01L 21/568* (2013.01); *H01L 2224/0508* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05164* (2013.01); *H01L 2224/05166* (2013.01); *H01L 2224/05169* (2013.01); *H01L 2224/05171* (2013.01); *H01L 2224/05172* (2013.01); *H01L 2224/05184* (2013.01); *H01L 2224/1134* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16225* (2013.01); *H01L 2224/32225* (2013.01); *H01L 2224/48091* (2013.01); *H01L 2224/48227* (2013.01); *H01L 2224/73265* (2013.01); *H01L 2224/97* (2013.01); *H01L 2924/00011* (2013.01); *H01L 2924/01322* (2013.01); *H01L 2924/10252* (2013.01); *H01L 2924/10253* (2013.01); *H01L 2924/10272* (2013.01); *H01L 2924/10329* (2013.01); *H01L 2924/10335* (2013.01); *H01L 2924/12041* (2013.01); *H01L 2924/12042* (2013.01); *H01L 2924/1306* (2013.01); *H01L 2924/13091* (2013.01); *H01L 2924/181* (2013.01)

(58) Field of Classification Search
CPC ......... H01L 24/81; H01L 24/96; H01L 24/97; H01L 2224/0508; H01L 2224/05111; H01L 2224/05124; H01L 2224/05139; H01L 2224/05144; H01L 2224/05147; H01L 2224/05155; H01L 2224/023–024; H01L 23/28–3192; H01L 21/56–568; H01L 2924/181–186; H01L 2225/065
See application file for complete search history.

(56) References Cited

U.S. PATENT DOCUMENTS

| | | |
|---|---|---|
| 6,136,137 A | 10/2000 | Farnworth et al. |
| 6,525,407 B1 | 2/2003 | Drewery |
| 7,109,587 B1 | 9/2006 | Li |
| 7,190,080 B1 | 3/2007 | Leu et al. |
| 7,388,294 B2 | 6/2008 | Klein et al. |
| 7,642,128 B1 | 1/2010 | Lin et al. |
| 7,745,910 B1 * | 6/2010 | Olson ................... H01L 23/552 257/659 |
| 7,786,577 B2 | 8/2010 | Dangelmaier et al. |
| 8,258,633 B2 | 9/2012 | Sezi et al. |
| 8,309,864 B2 | 11/2012 | Kobayashi et al. |
| 8,367,475 B2 | 2/2013 | Law et al. |
| 8,367,476 B2 | 2/2013 | Benjavasukul et al. |
| 8,659,166 B2 | 2/2014 | Sasaki et al. |
| 2003/0170450 A1 | 9/2003 | Stewart et al. |
| 2004/0113283 A1 | 6/2004 | Farnworth et al. |
| 2004/0145051 A1 | 7/2004 | Klein et al. |
| 2005/0017353 A1 | 1/2005 | Seddon et al. |
| 2005/0051877 A1 | 3/2005 | Hsu |
| 2005/0269715 A1 | 12/2005 | Yoo |
| 2007/0029666 A1 | 2/2007 | Goh et al. |
| 2009/0011543 A1 | 1/2009 | Karta et al. |
| 2009/0091001 A1 | 4/2009 | Park |
| 2009/0166835 A1 | 7/2009 | Yang et al. |
| 2009/0196011 A1 | 8/2009 | Kobayashi et al. |
| 2009/0215227 A1 | 8/2009 | Tan et al. |
| 2009/0289356 A1 | 11/2009 | Camacho et al. |
| 2010/0095739 A1 | 4/2010 | DeNatale et al. |
| 2010/0127360 A1 | 5/2010 | Pagaila et al. |
| 2010/0230795 A1 | 9/2010 | Kriman et al. |
| 2010/0252828 A1 | 10/2010 | Grillberger et al. |
| 2010/0258932 A1 | 10/2010 | Yoshida et al. |
| 2011/0001238 A1 | 1/2011 | Wakisaka et al. |
| 2011/0014746 A1 | 1/2011 | Do et al. |
| 2011/0024888 A1 | 2/2011 | Pagaila et al. |
| 2011/0037169 A1 | 2/2011 | Pagaila |
| 2011/0042796 A1 | 2/2011 | Chang et al. |
| 2011/0049695 A1 | 3/2011 | Shin et al. |
| 2011/0095413 A1 | 4/2011 | Barth et al. |
| 2011/0101491 A1 | 5/2011 | Skeete et al. |
| 2011/0101512 A1 | 5/2011 | Choi et al. |
| 2011/0104853 A1 * | 5/2011 | Lo ......................... H01L 21/568 257/E21.502 |
| 2011/0127668 A1 | 6/2011 | Lin et al. |
| 2011/0204505 A1 | 8/2011 | Pagaila et al. |
| 2011/0221055 A1 | 9/2011 | Lin et al. |
| 2011/0221069 A1 | 9/2011 | Kunimoto |
| 2011/0233766 A1 | 9/2011 | Lin et al. |
| 2011/0241222 A1 | 10/2011 | Sezi et al. |
| 2011/0272824 A1 | 11/2011 | Pagaila |
| 2011/0278703 A1 | 11/2011 | Pagaila et al. |
| 2011/0278717 A1 | 11/2011 | Pagaila et al. |
| 2011/0278736 A1 | 11/2011 | Lin et al. |
| 2011/0318876 A1 | 12/2011 | Lee et al. |
| 2012/0001339 A1 | 1/2012 | Malatkar |
| 2012/0018858 A1 | 1/2012 | Chen et al. |
| 2012/0018874 A1 | 1/2012 | Lin et al. |
| 2012/0018904 A1 | 1/2012 | Lin et al. |
| 2012/0038047 A1 | 2/2012 | Do et al. |
| 2012/0049388 A1 | 3/2012 | Pagaila |
| 2012/0074587 A1 | 3/2012 | Koo et al. |
| 2012/0112340 A1 | 5/2012 | Lin et al. |
| 2012/0112351 A1 | 5/2012 | Walczyk et al. |
| 2012/0126427 A1 | 5/2012 | Sasaki et al. |
| 2012/0139120 A1 | 6/2012 | Chow et al. |
| 2012/0146181 A1 | 6/2012 | Lin et al. |
| 2012/0168089 A1 | 7/2012 | Schmidt-Lange et al. |
| 2012/0186793 A1 | 7/2012 | Brunschwiler et al. |
| 2012/0187568 A1 | 7/2012 | Lin et al. |
| 2012/0187584 A1 | 7/2012 | Lin et al. |

(56) References Cited

U.S. PATENT DOCUMENTS

| | | |
|---|---|---|
| 2012/0241925 A1 | 9/2012 | Yoon et al. |
| 2012/0241955 A1* | 9/2012 | Law .................... H01L 21/568 |
| | | 257/737 |
| 2012/0273959 A1 | 11/2012 | Park et al. |
| 2012/0273960 A1 | 11/2012 | Park et al. |
| 2012/0286429 A1 | 11/2012 | Han et al. |
| 2013/0037935 A1 | 2/2013 | Xue et al. |
| 2013/0087931 A1 | 4/2013 | Phua et al. |
| 2013/0095612 A1 | 4/2013 | Huang et al. |
| 2013/0127018 A1 | 5/2013 | Phua et al. |
| 2013/0168849 A1* | 7/2013 | Scanlan ................ H01L 21/78 |
| | | 257/E21.507 |
| 2013/0168874 A1 | 7/2013 | Scanlan |
| 2013/0200528 A1 | 8/2013 | Lin et al. |
| 2013/0341774 A1 | 12/2013 | Chang et al. |
| 2014/0001652 A1* | 1/2014 | Chen .................... H01L 21/561 |
| | | 257/E23.141 |
| 2014/0070420 A1* | 3/2014 | Sapone ................ H01L 24/96 |
| | | 257/773 |
| 2014/0091482 A1 | 4/2014 | Lin et al. |
| 2014/0103488 A1 | 4/2014 | Chen et al. |
| 2014/0103527 A1 | 4/2014 | Marimuthu et al. |
| 2014/0110842 A1 | 4/2014 | Zenz et al. |
| 2014/0131896 A1 | 5/2014 | Yu et al. |
| 2014/0183718 A1 | 7/2014 | Han et al. |
| 2015/0187710 A1 | 7/2015 | Scanlan et al. |

FOREIGN PATENT DOCUMENTS

| | | |
|---|---|---|
| CN | 101989558 A | 3/2011 |
| CN | 102097337 A | 6/2011 |
| CN | 102105982 A | 6/2011 |
| CN | 102163561 A | 8/2011 |
| CN | 102244012 A | 11/2011 |
| CN | 102244013 A | 11/2011 |
| CN | 102299086 A | 12/2011 |
| CN | 102347253 A | 2/2012 |
| CN | 102347272 A | 2/2012 |
| CN | 102386108 A | 3/2012 |
| CN | 102569210 A | 7/2012 |
| CN | 102709200 A | 10/2012 |
| CN | 103035578 A | 4/2013 |
| CN | 103117232 A | 5/2013 |
| CN | 203288575 U | 11/2013 |
| CN | 102903642 B | 4/2015 |
| JP | H0492459 A | 3/1992 |
| JP | H08306828 A | 11/1996 |
| JP | 3455948 B2 | 10/2003 |
| JP | 2007134370 A | 5/2007 |
| JP | 2007259410 A | 10/2007 |
| JP | 2009277854 A | 11/2009 |
| JP | 2010245384 A | 10/2010 |
| JP | 4812525 B2 | 11/2011 |
| KR | 20080106155 A | 12/2008 |
| KR | 20090072958 A | 7/2009 |
| TW | 201246483 A | 11/2012 |

* cited by examiner

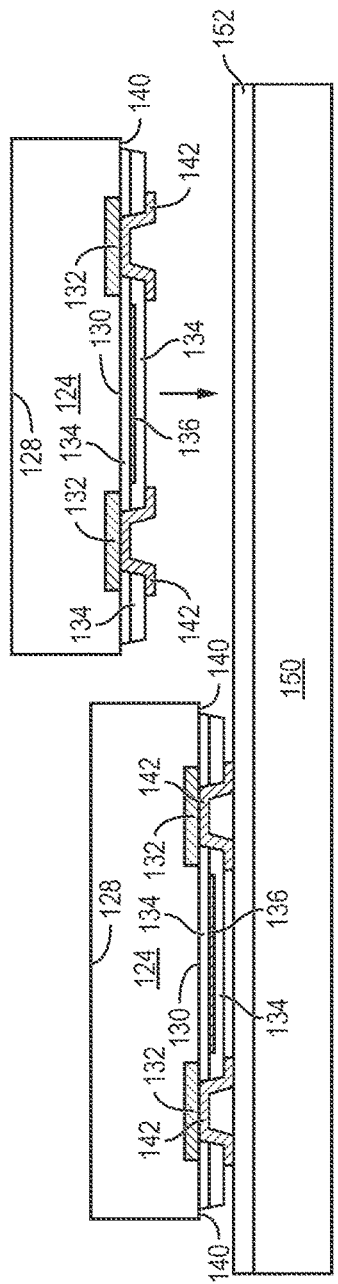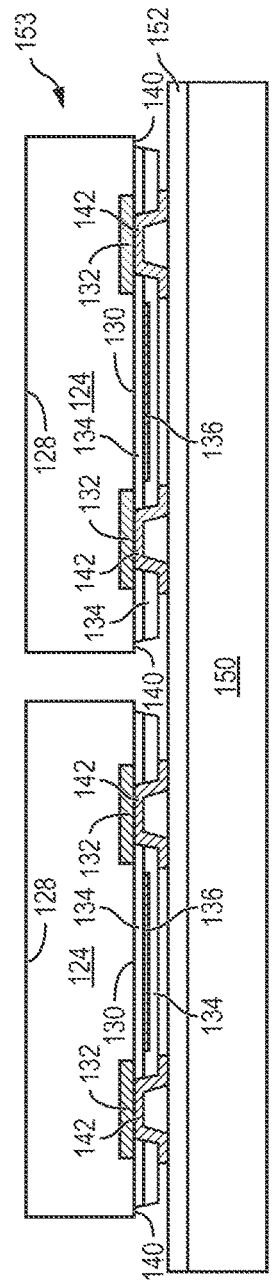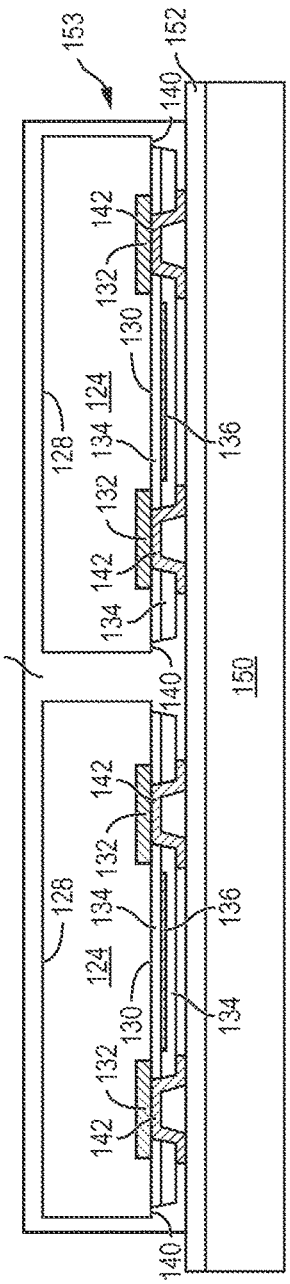
FIG. 4a
FIG. 4b
FIG. 4c

SEMICONDUCTOR DEVICE WITH ENCAPSULANT DEPOSITED ALONG SIDES AND SURFACE EDGE OF SEMICONDUCTOR DIE IN EMBEDDED WLCSP

CLAIM TO DOMESTIC PRIORITY

The present application is a continuation of U.S. application Ser. No. 16/687,865, now U.S. Pat. No. 11,222,793, filed Nov. 19, 2019, which is a division of U.S. application Ser. No. 15/274,590, now U.S. Pat. No. 10,515,828, filed Sep. 23, 2016, which is a continuation of U.S. patent application Ser. No. 13/832,809, now U.S. Pat. No. 9,496,195, filed Mar. 15, 2013, which claims the benefit of U.S. Provisional Application No. 61/744,699, filed Oct. 2, 2012, which applications are incorporated herein by reference.

FIELD OF THE INVENTION

The present invention relates in general to semiconductor devices and, more particularly, to a semiconductor device and method of depositing an encapsulant over the sides and an exposed portion of an active surface of a semiconductor die in a fan-out wafer level chip scale packages (Fo-WLCSP).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays.

Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Semiconductor die are typically enclosed within a semiconductor package for electrical interconnect, structural support, and environmental protection of the die. The semiconductor can be subject to damage or degradation if a portion of the semiconductor die is exposed to external elements, particularly when surface mounting the die. For example, the semiconductor die can be damaged or degraded during handling and exposure to light.

BRIEF DESCRIPTION OF THE DRAWINGS

FIGS. 4a-4e illustrate a process of depositing an encapsulant over the sides and an exposed portion of an active surface of a semiconductor die in a WLCSP;

DETAILED DESCRIPTION OF THE DRAWINGS

Figure 1:
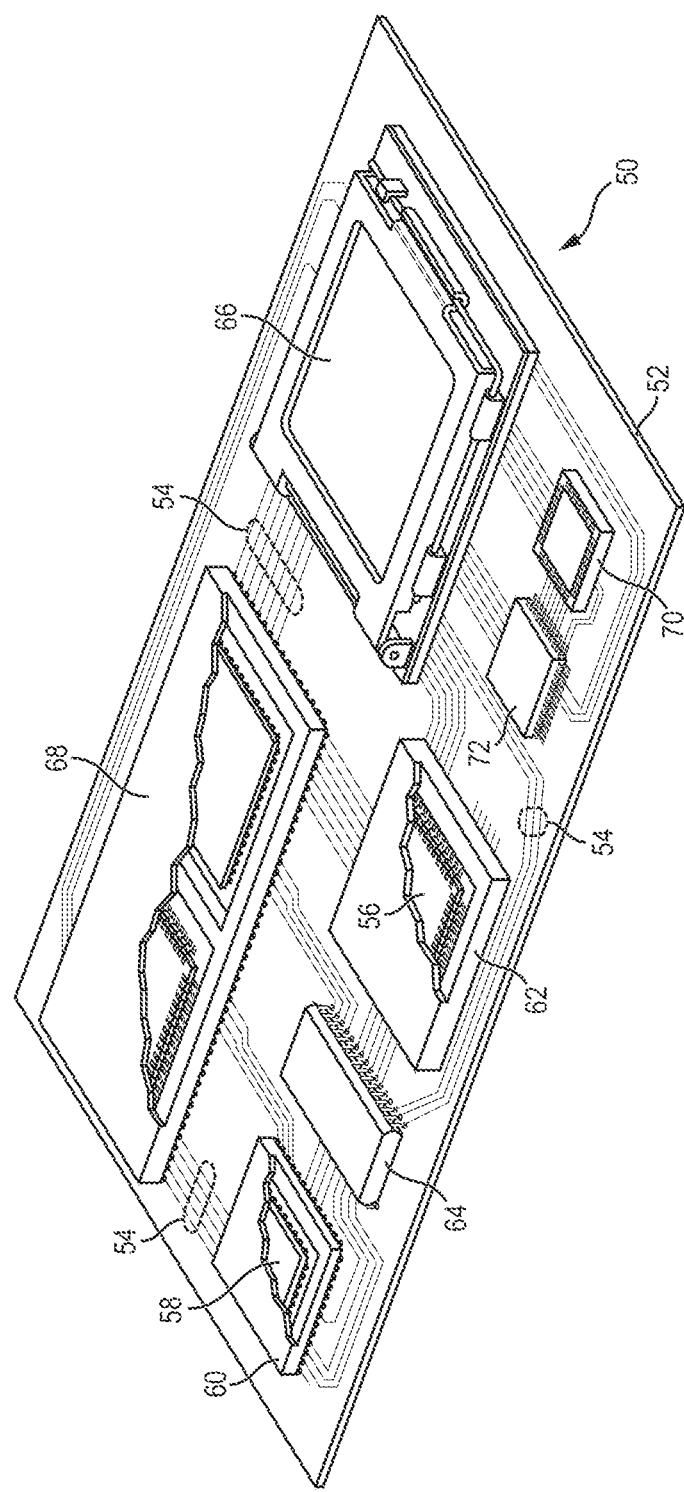
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
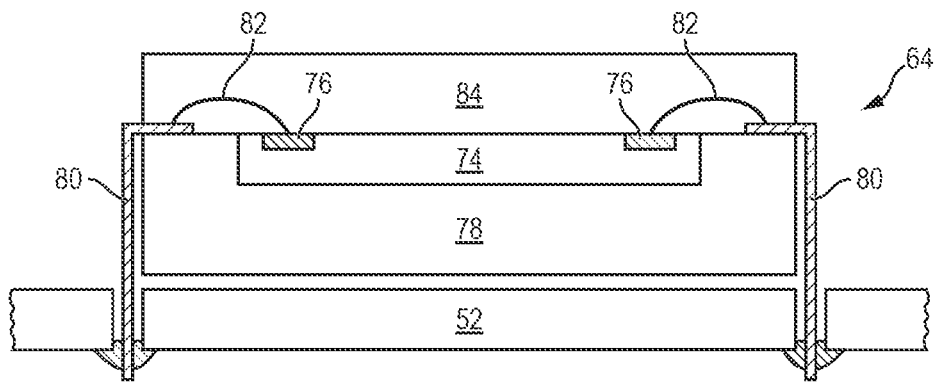
FIGS. 2a-2c illustrate further detail of the representative semiconductor packages mounted to the PCB.
Figure 2B:
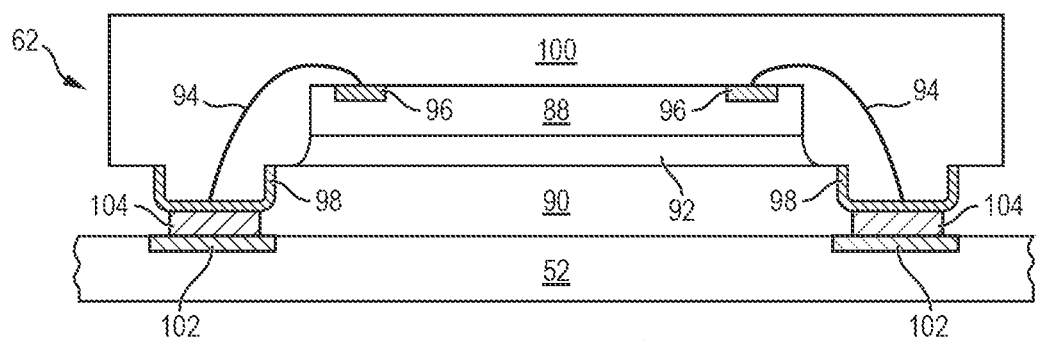
Figure 2C:
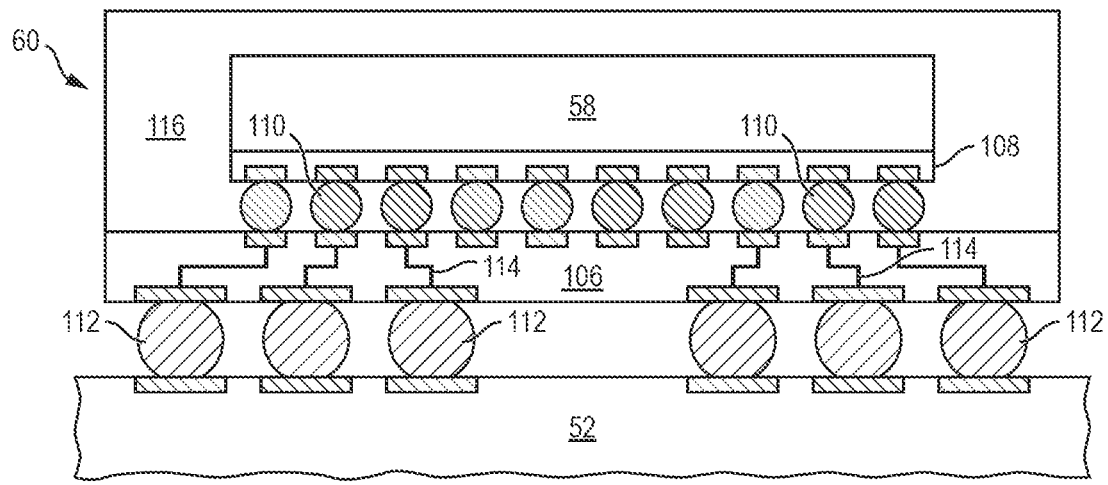

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
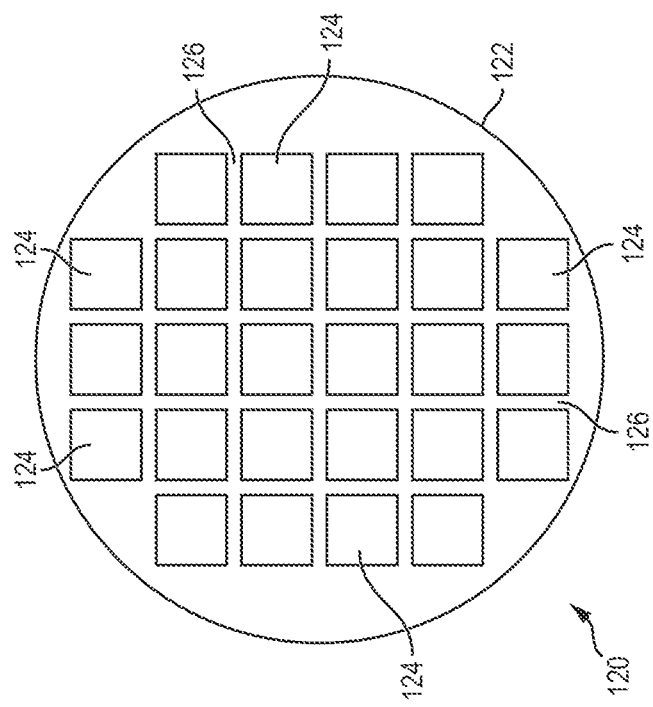
FIGS. 3a-3d illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 is 200-300 millimeters (mm) in diameter.

Figure 3B:
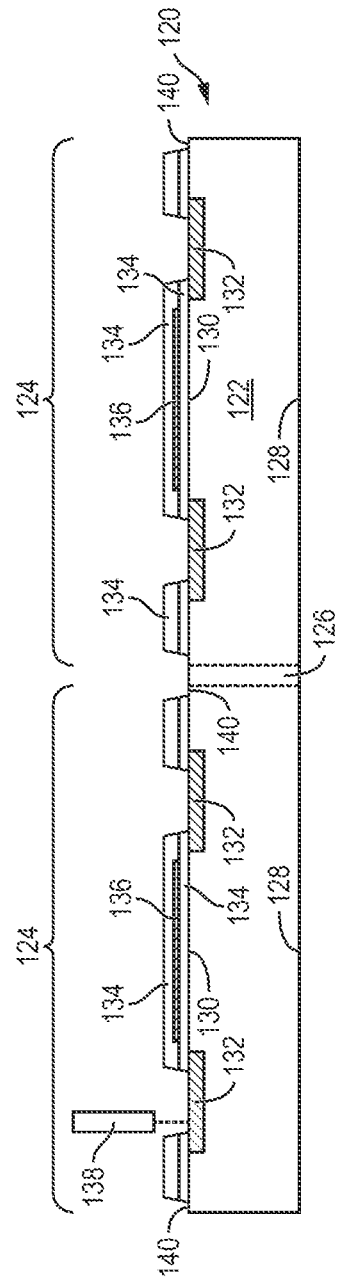

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

A first insulating or passivation layer 134 is formed over semiconductor die 124 and conductive layer 132 using PVD, CVD, printing, spin coating, spray coating, sintering or thermal oxidation. The insulating layer 134 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), hafnium oxide ($HfO_2$), benzocyclobutene (BCB), polyimide (PI), polybenzoxazoles (PBO), polymer, or other dielectric material having similar structural and insulating properties.

An electrically conductive layer or redistribution layer (RDL) 136 is formed over the first insulating layer 134 using a patterning and metal deposition process such as sputtering, electrolytic plating, and electroless plating. Conductive layer 136 can be one or more layers of Al, Cu, Sn, Ni, Au, Ag, or other suitable electrically conductive material. One portion of conductive layer 136 is electrically connected to conductive layer 132 of semiconductor die 124. Other portions of conductive layer 136 can be electrically common or electrically isolated depending on the design and function of semiconductor die 124.

A second insulating or passivation layer 134 is formed over conductive layer 136 and the first insulating layer 134. Multiple insulating layers 134 and conductive layers 136 can be formed over active surface 130 of semiconductor die 124. A surface inspection can be performed to detect passivation or RDL defects.

A portion of insulating layer 134 is removed by laser direct ablation (LDA) using laser 138 to expose conductive layer 132 and portion 140 of active surface 130 along a surface edge of semiconductor die 124. That is, portion 140 of active surface 130 along a surface edge of semiconductor die 124 is devoid of insulating layer 134. Alternatively, a portion of insulating layer 134 is removed by an etching process through a patterned photoresist layer to expose conductive layer 132 and portion 140 of active surface 130 along the surface edge of semiconductor die 124.

Figure 3C:
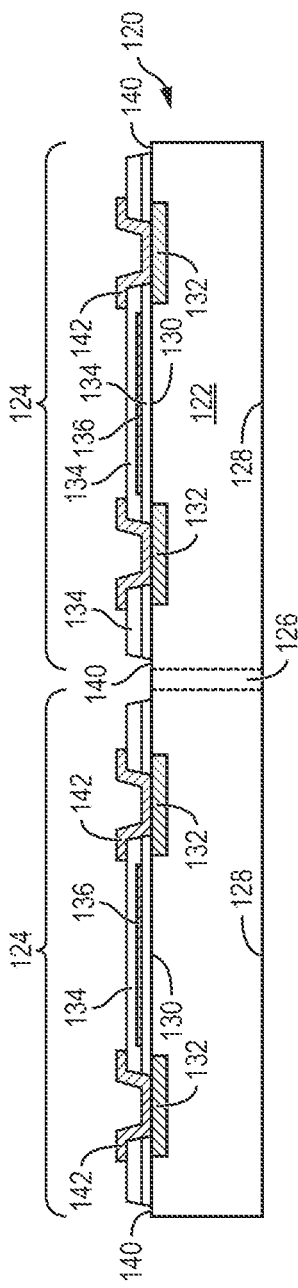

In FIG. 3c, an electrically conductive layer 142 is formed over the exposed portion of conductive layer 132 and insulating layer 134 after final repassivation using PVD, CVD, evaporation, electrolytic plating, electroless plating, or other suitable metal deposition process. Conductive layer 142 can be Al, Cu, Sn, Ni, Au, Ag, tungsten (W), or other suitable electrically conductive material. Conductive layer 142 is a UBM electrically connected to conductive layer 132. UBMs 142 can be a multi-metal stack with adhesion layer, barrier layer, and seed or wetting layer. The adhesion layer is formed over conductive layer 132 and can be titanium (Ti), titanium nitride (TiN), titanium tungsten (TiW), Al, or chromium (Cr). The barrier layer is formed over the adhesion layer and can be Ni, NiV, platinum (Pt), palladium (Pd), TiW, or chromium copper (CrCu). The barrier layer inhibits the diffusion of Cu into the active area of the die. The seed layer is formed over the barrier layer and can be Cu, Ni, NiV, Au, or Al. UBMs 142 provide a low resistive interconnect to conductive layer 132, as well as a barrier to solder diffusion and seed layer for solder wettability.

Figure 3D:
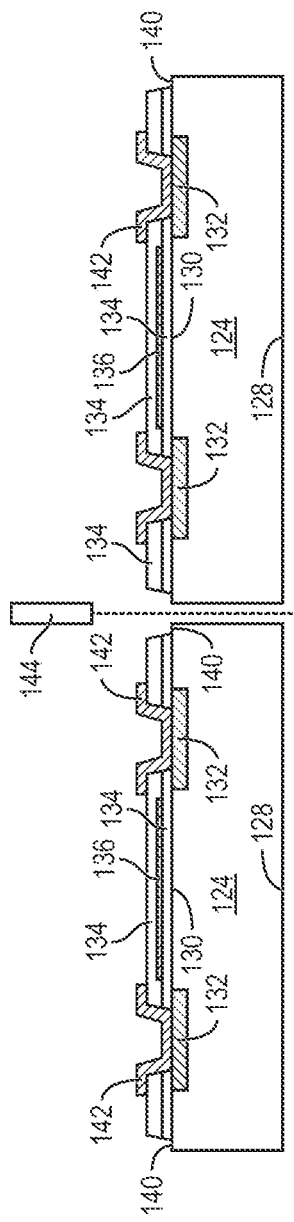

In FIG. 3d, semiconductor wafer 120 is singulated through saw street 126 using a saw blade or laser cutting tool 144 into individual semiconductor die 124.

Figure 4D:
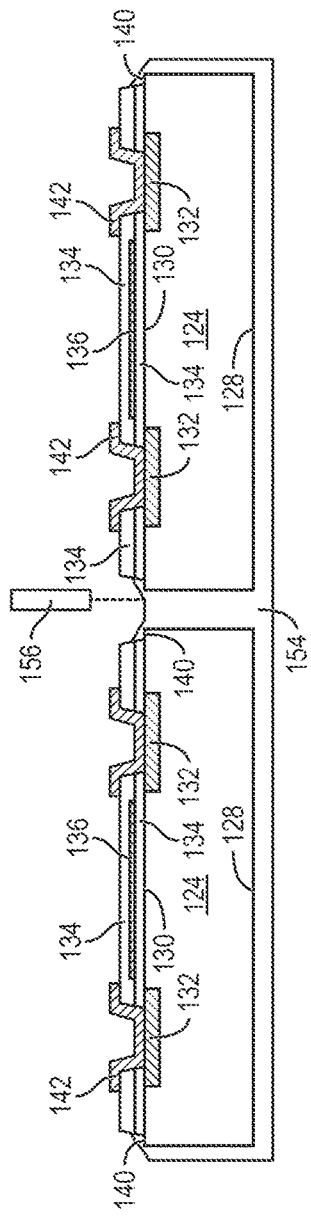

FIGS. 4a-4e illustrate, in relation to FIGS. 1 and 2a-2c, a process of depositing an encapsulant over the sides and an exposed portion of an active surface of a semiconductor die in a WLCSP. FIG. 4a shows a cross-sectional view of a portion of a carrier or temporary substrate 150 containing sacrificial base material such as silicon, polymer, beryllium oxide, glass, or other suitable low-cost, rigid material for structural support. An interface layer or double-sided tape 152 is formed over carrier 150 as a temporary adhesive bonding film, etch-stop layer, or thermal release layer. Carrier 150 can be a large round or rectangular panel (greater than 300 mm) with capacity for multiple semiconductor die 124.

Semiconductor die 124 from FIG. 3d are mounted to carrier 150 and interface layer 152 using, for example, a pick and place operation with insulating layer 134 oriented toward the carrier. FIG. 4b shows semiconductor die 124 mounted to interface layer 152 of carrier 150 as reconstituted wafer 153. Active surface 130 of semiconductor die 124 is held off or offset from interface layer 152 by nature of insulating layer 134 and/or conductive layer 142 contacting the interface layer, i.e., there is a gap between portion 140 of active surface 130 and interface layer 152.

In FIG. 4c, an encapsulant or molding compound 154 is deposited over semiconductor die 124 and carrier 150 using a paste printing, compressive molding, transfer molding, liquid encapsulant molding, vacuum lamination, spin coating, or other suitable applicator. Encapsulant 154 can be polymer composite material, such as epoxy resin with filler, epoxy acrylate with filler, or polymer with proper filler. Encapsulant 154 is non-conductive and environmentally protects the semiconductor device from external elements and contaminants. In particular, encapsulant 154 is disposed along the sides of semiconductor die 124 and in the gap between active surface 130 and interface layer 152 and thus covers the sides of semiconductor die 124 and exposed portion 140 of active surface 130 along the surface edge of the semiconductor die up to insulating layer 134.

Accordingly, encapsulant 154 covers or contacts at least five surfaces of semiconductor die 124, i.e., four side surfaces and portion 140 of active surface 130 of the semiconductor die.

In FIG. 4d, carrier 150 and interface layer 152 are removed by chemical etching, mechanical peeling, chemical mechanical planarization (CMP), mechanical grinding, thermal bake, UV light, laser scanning, or wet stripping to expose insulating layer 134 and conductive layer 142. A portion of encapsulant 154 is removed by LDA using laser 156. Alternatively, a portion of encapsulant 154 is removed by an etching process through a patterned photoresist layer. Portion 140 of active surface 130 along the surface edge of semiconductor die 124, as well as the sides of the semiconductor die, remain covered by encapsulant 154 as a protective panel to increase yield, particularly when surface mounting the semiconductor die. Encapsulant 154 also protects semiconductor die 124 from degradation due to exposure to light. Semiconductor die 124 is prepared for electrical testing by cleaning insulating layer 134 and conductive layer 142 with one or more steps of plasma, wet solvent, copper oxide, or dry cleaning.

Figure 4E:
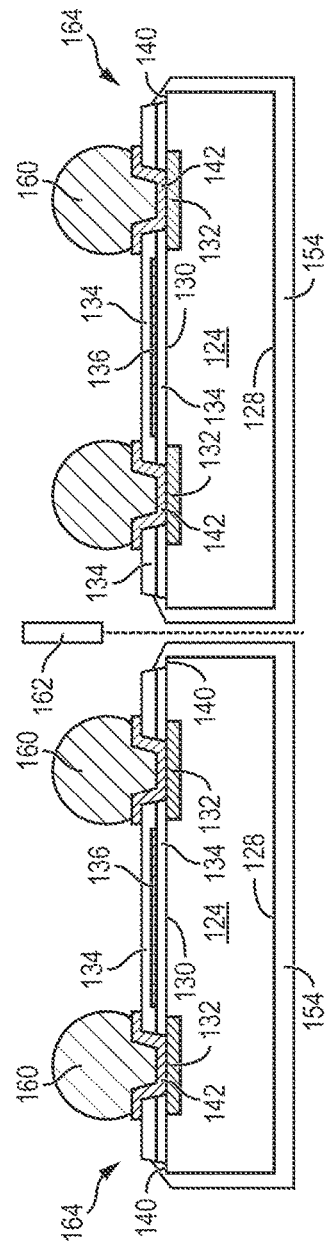

In FIG. 4e, an electrically conductive bump material is deposited over conductive layer 142 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, lead (Pb), Bi, Cu, solder, and combinations thereof, with an optional flux solution. For example, the bump material can be eutectic Sn/Pb, high-lead solder, or lead-free solder. The bump material is bonded to conductive layer 142 using a suitable attachment or bonding process. In one embodiment, the bump material is reflowed by heating the material above its melting point to form balls or bumps 160. In some applications, bumps 160 are reflowed a second time to improve electrical contact to conductive layer 142. Bumps 160 can also be compression bonded or thermocompression bonded to conductive layer 142. Bumps 160 represent one type of interconnect structure that can be formed over conductive layer 142. The interconnect structure can also use bond wires, conductive paste, stud bump, micro bump, or other electrical interconnect. Laser marking can be performed before or after bump formation, or after removal of carrier 150.

Figure 5:
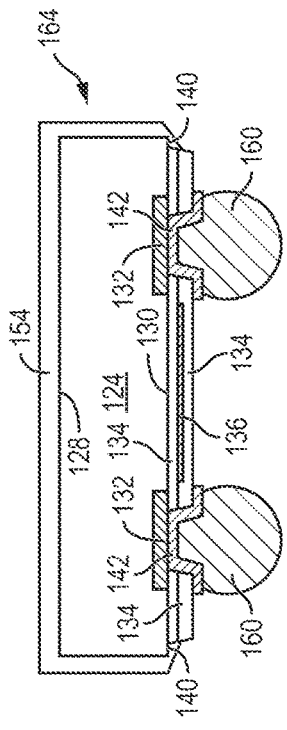
FIG. 5 illustrates the WLCSP with the sides and the exposed portion of the active surface of the semiconductor die covered with the encapsulant.

Semiconductor die 124 are singulated through encapsulant 154 with saw blade or laser cutting tool 162 into individual embedded wafer level ball grid array (eWLB) or wafer-level chip scale package (WLCSP) 164. FIG. 5 shows WLCSP 164 after singulation. In one embodiment, WLCSP 164 has dimensions of 3.0×2.6×0.7 millimeters mm with 0.4 mm pitch. Semiconductor die 124 is electrically connected to bumps 160 for external interconnect. Encapsulant 154 covers the sides of semiconductor die 124 and portion 140 of active surface 130 to protect the sides and surface edge of the semiconductor die and increase manufacturing yield, particularly when surface mounting the semiconductor die. Encapsulant 154 also protects semiconductor die 124 from degradation due to exposure to light. WLCSP 164 undergoes electrical testing before or after singulation.

Figure 6A:
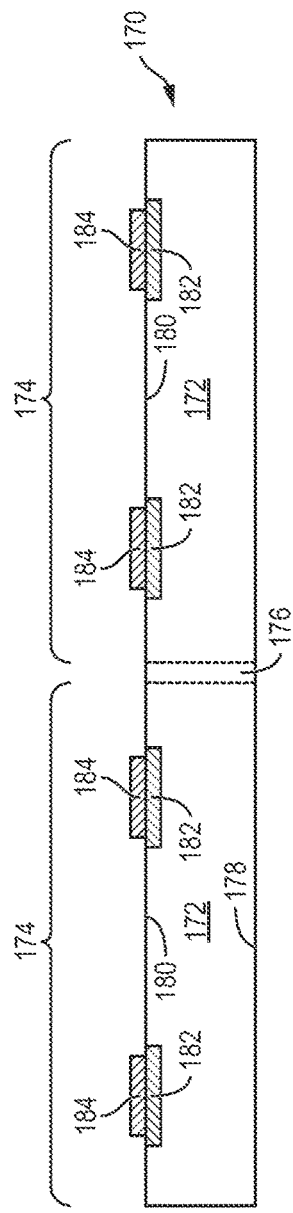
FIGS. 6a-6c illustrate a semiconductor wafer with a plurality of semiconductor die separated by a saw street.
Figure 6B:
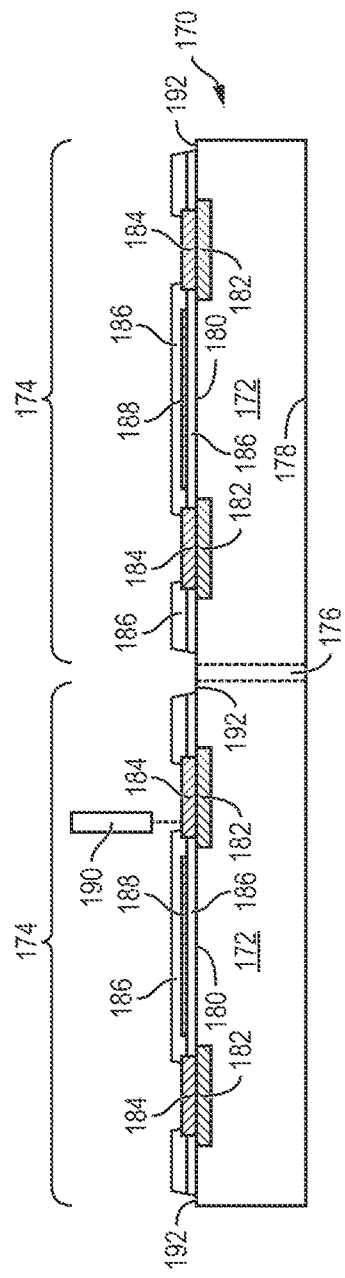
Figure 6C:
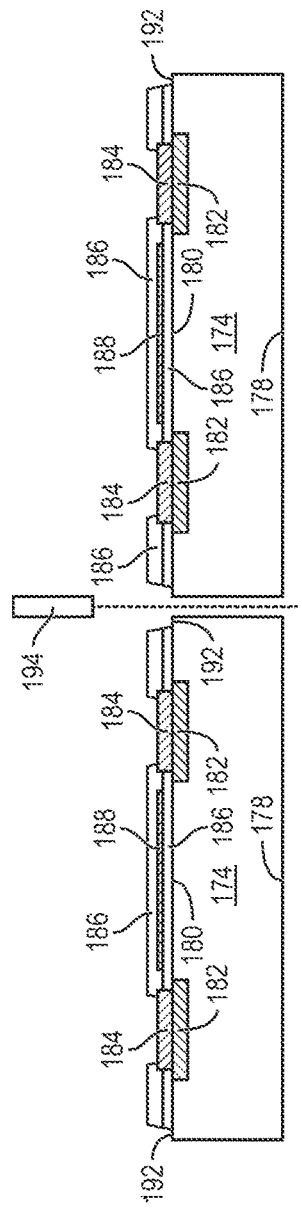

FIGS. 6a-6c illustrate another embodiment of semiconductor wafer 170 with a base substrate material 172, such as silicon, germanium, gallium arsenide, indium phosphide, or silicon carbide, for structural support, similar to FIG. 3a. A plurality of semiconductor die or components 174 is formed on wafer 170 separated by a non-active, inter-die wafer area or saw street 176 as described above. Saw street 176 provides cutting areas to singulate semiconductor wafer 170 into individual semiconductor die 174. In one embodiment, semiconductor wafer 170 is 200-300 millimeters (mm) in diameter.

FIG. 6a shows a cross-sectional view of a portion of semiconductor wafer 170. Each semiconductor die 174 has a back surface 178 and active surface 180 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 180 to implement analog circuits or digital circuits, such as DSP, ASIC, memory, or other signal processing circuit. Semiconductor die 174 may also contain IPDs, such as inductors, capacitors, and resistors, for RF signal processing.

An electrically conductive layer 182 is formed over active surface 180 using PVD, CVD, electrolytic plating, electroless plating process, or other suitable metal deposition process. Conductive layer 182 can be one or more layers of Al, Cu, Sn, Ni, Au, Ag, or other suitable electrically conductive material. Conductive layer 182 operates as contact pads electrically connected to the circuits on active surface 180. Conductive layer 182 can be formed as contact pads disposed side-by-side a first distance from the edge of semiconductor die 174, as shown in FIG. 6a. Alternatively, conductive layer 182 can be formed as contact pads that are offset in multiple rows such that a first row of contact pads is disposed a first distance from the edge of the die, and a second row of contact pads alternating with the first row is disposed a second distance from the edge of the die.

An electrically conductive layer 184 is formed over conductive layer 182 using PVD, CVD, evaporation, electrolytic plating, electroless plating, or other suitable metal deposition process. Conductive layer 184 can be Al, Cu, Sn, Ni, Au, Ag, W, or other suitable electrically conductive material. Conductive layer 184 is a UBM electrically connected to conductive layer 182. UBMs 184 can be a multi-metal stack with adhesion layer, barrier layer, and seed or wetting layer. The adhesion layer is formed over conductive layer 182 and can be Ti, TiN, TiW, Al, or Cr. The barrier layer is formed over the adhesion layer and can be Ni, NiV, Pt, Pd, TiW, or CrCu. The barrier layer inhibits the diffusion of Cu into the active area of the die. The seed layer is formed over the barrier layer and can be Cu, Ni, NiV, Au, or Al. UBMs 184 provide a low resistive interconnect to conductive layer 182, as well as a barrier to solder diffusion and seed layer for solder wettability.

In FIG. 6b, a first insulating or passivation layer 186 is formed over semiconductor die 174 and conductive layer 184 using PVD, CVD, printing, spin coating, spray coating, sintering or thermal oxidation, i.e., passivation occurs after formation of UBM 184. The insulating layer 186 contains one or more layers of SiO2, Si3N4, SiON, Ta2O5, Al2O3, HfO2, BCB, PI, PBO, polymer, or other dielectric material having similar structural and insulating properties.

An electrically conductive layer or RDL 188 is formed over the first insulating layer 186 using a patterning and metal deposition process such as sputtering, electrolytic plating, and electroless plating. Conductive layer 188 can be one or more layers of Al, Cu, Sn, Ni, Au, Ag, or other suitable electrically conductive material. One portion of conductive layer 188 is electrically connected to conductive layer 182 of semiconductor die 174. Other portions of conductive layer 188 can be electrically common or electrically isolated depending on the design and function of semiconductor die 174.

A second insulating or passivation layer 186 is formed over conductive layer 188 and the first insulating layer 186. Multiple insulating layers 186 and conductive layers 188 can be formed over active surface 180 of semiconductor die 174. A surface inspection can be performed to detect passivation or RDL defects.

A portion of insulating layer 186 is removed by LDA using laser 190 to expose conductive layer 184 and portion 192 of active surface 180 along a surface edge of semiconductor die 174. That is, portion 192 of active surface 180 along a surface edge of semiconductor die 174 is devoid of insulating layer 186. Alternatively, a portion of insulating layer 186 is removed by an etching process through a patterned photoresist layer to expose conductive layer 182 and portion 192 of active surface 180 along the surface edge of semiconductor die 174.

In FIG. 6c, semiconductor wafer 170 is singulated through saw street 176 using a saw blade or laser cutting tool 194 into individual semiconductor die 174.

Figure 7A:
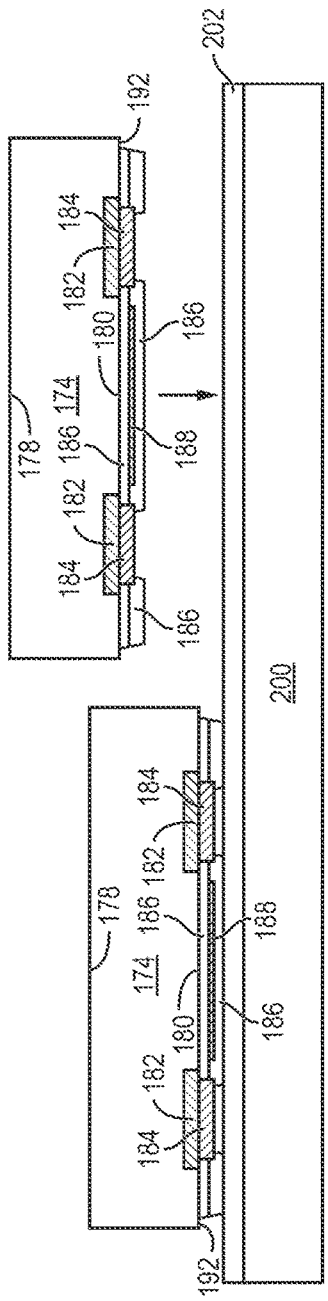
FIGS. 7a-7e illustrate another process of depositing an encapsulant over the sides and an exposed portion of an active surface of a semiconductor die in a WLCSP.

FIGS. 7a-7e illustrate, in relation to FIGS. 1 and 2a-2c, another process of depositing an encapsulant over the sides and an exposed portion of an active surface of a semiconductor die in a WLCSP. FIG. 7a shows a cross-sectional view of a portion of a carrier or temporary substrate 200 containing sacrificial base material such as silicon, polymer, beryllium oxide, glass, or other suitable low-cost, rigid material for structural support. An interface layer or double-sided tape 202 is formed over carrier 200 as a temporary adhesive bonding film, etch-stop layer, or thermal release layer. Carrier 200 can be a large round or rectangular panel (greater than 300 mm) with capacity for multiple semiconductor die 174.

Figure 7B:
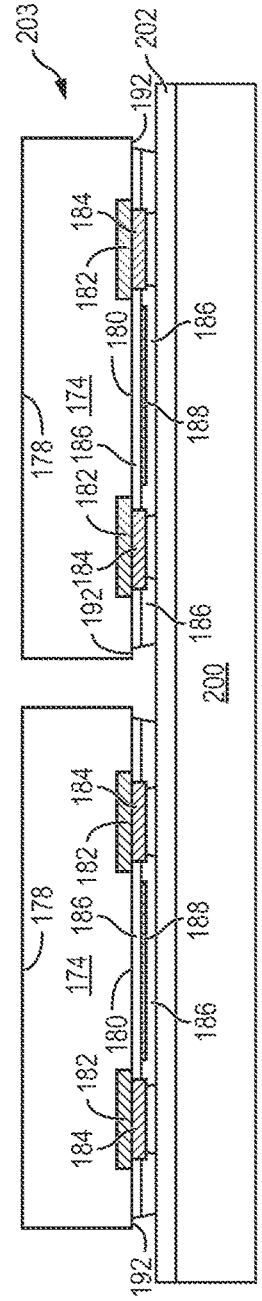

Semiconductor die 174 from FIG. 6c are mounted to carrier 200 and interface layer 202 using, for example, a pick and place operation with insulating layer 186 oriented toward the carrier. FIG. 7b shows semiconductor die 174 mounted to interface layer 202 of carrier 200 as reconstituted wafer 203. Active surface 180 of semiconductor die 174 is held off or offset from interface layer 202 by nature of insulating layer 186 contacting the interface layer, i.e., there is a gap between portion 192 of active surface 180 and interface layer 202.

Figure 7C:
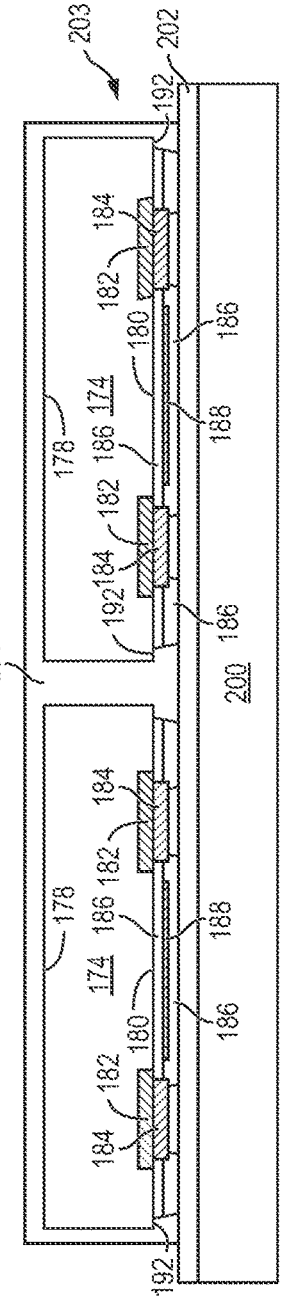

In FIG. 7c, an encapsulant or molding compound 204 is deposited over semiconductor die 174 and carrier 200 using a paste printing, compressive molding, transfer molding, liquid encapsulant molding, vacuum lamination, spin coating, or other suitable applicator. Encapsulant 204 can be polymer composite material, such as epoxy resin with filler, epoxy acrylate with filler, or polymer with proper filler. Encapsulant 204 is non-conductive and environmentally protects the semiconductor device from external elements and contaminants. In particular, encapsulant 204 is disposed along the sides of semiconductor die 174 and in the gap between active surface 180 and interface layer 202 and thus covers the sides of semiconductor die 174 and exposed portion 192 of active surface 180 along the surface edge of the semiconductor die up to insulating layer 186. Accordingly, encapsulant 204 covers or contacts at least five surfaces of semiconductor die 174, i.e., four side surfaces and portion 192 of active surface 180 of the semiconductor die.

Figure 7D:
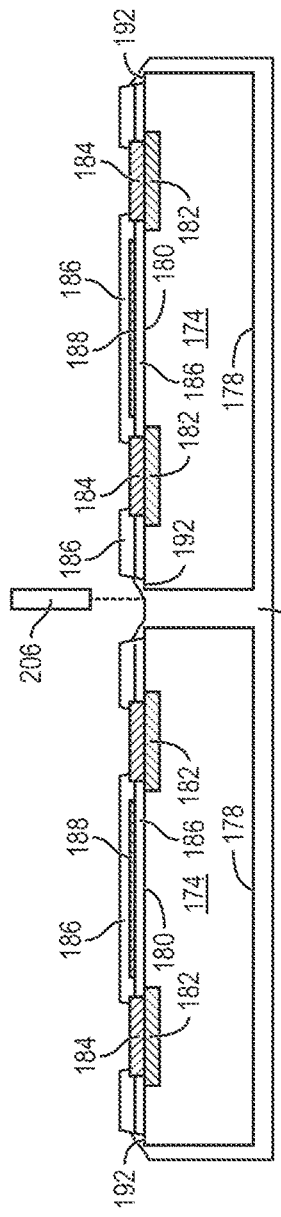

In FIG. 7d, carrier 200 and interface layer 202 are removed by chemical etching, mechanical peeling, CMP, mechanical grinding, thermal bake, UV light, laser scanning, or wet stripping to expose insulating layer 186 and conductive layer 184. A portion of encapsulant 204 is removed by LDA using laser 206. Alternatively, a portion of encapsulant 204 is removed by an etching process through a patterned photoresist layer. Portion 192 of active surface 180 along the surface edge of semiconductor die 124, as well as the sides of the semiconductor die, remain covered by encapsulant 204 as a protective panel to increase yield, particularly when surface mounting the semiconductor die. Encapsulant 204 also protects semiconductor die 174 from degradation due to exposure to light. Semiconductor die 174 is prepared for electrical testing by cleaning insulating layer 186 and conductive layer 184 with one or more steps of plasma, wet solvent, copper oxide, or dry cleaning.

Figure 7E:
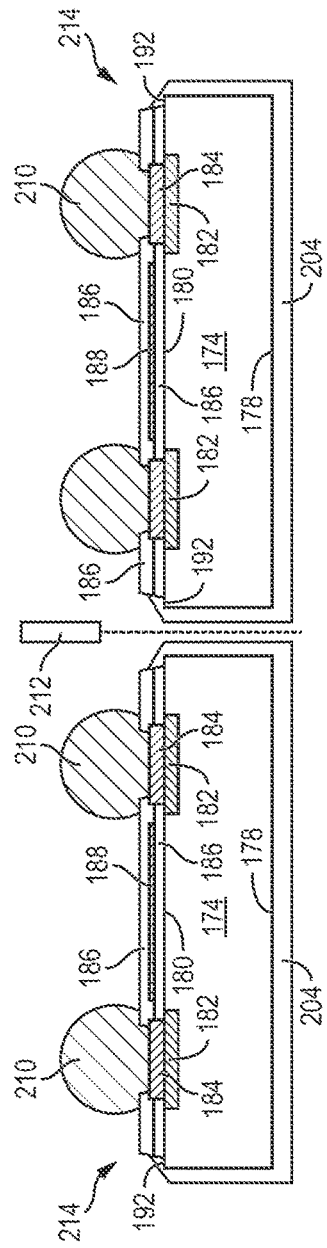

In FIG. 7e, an electrically conductive bump material is deposited over conductive layer 184 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 184 using a suitable attachment or bonding process. In one embodiment, the bump material is reflowed by heating the material above its melting point to form balls or bumps 210. In some applications, bumps 210 are reflowed a second time to improve electrical contact to conductive layer 184. Bumps 210 can also be compression bonded or thermocompression bonded to conductive layer 184. Bumps 210 represent one type of interconnect structure that can be formed over conductive layer 184. The interconnect structure can also use bond wires, conductive paste, stud bump, micro bump, or other electrical interconnect. Laser marking can be performed before or after bump formation, or after removal of carrier 200.

Figure 8:
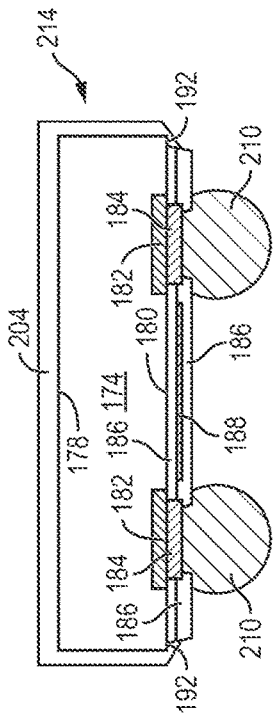
FIG. 8 illustrates the WLCSP with the sides and the exposed portion of the active surface of the semiconductor die covered with the encapsulant.

Semiconductor die 174 are singulated through encapsulant 204 with saw blade or laser cutting tool 212 into individual eWLB or WLCSP 214. FIG. 8 shows WLCSP 214 after singulation. In one embodiment, WLCSP 214 has dimensions of 3.0×2.6×0.7 millimeters mm with 0.4 mm pitch. Semiconductor die 174 is electrically connected to bumps 210 for external interconnect. Encapsulant 204 covers the sides of semiconductor die 174 and portion 192 of active surface 180 to protect the sides and surface edge of semiconductor die 174 and increase manufacturing yield, particularly when surface mounting the semiconductor die. Encapsulant 204 also protects semiconductor die 174 from degradation due to exposure to light. WLCSP 214 undergoes electrical testing before or after singulation.

Figure 9A:
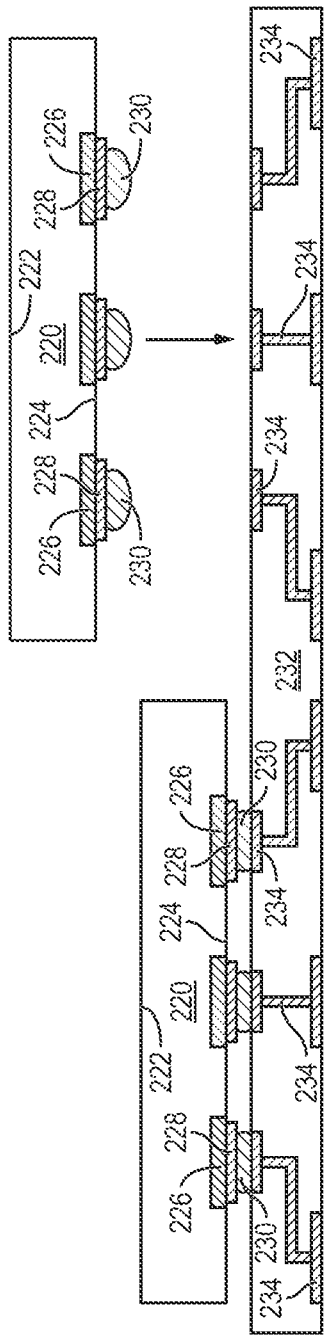
FIGS. 9a-9h illustrate a process of depositing a MUF material with the sides and a portion of an active surface of a semiconductor die in a WLCSP.

FIGS. 9a-9h illustrate, in relation to FIGS. 1 and 2a-2c, a process of depositing MUF material over the sides and an exposed portion of an active surface of a semiconductor die in a WLCSP. FIG. 9a shows a semiconductor die 220, from a semiconductor wafer similar to FIG. 3a, having a back surface 222 and active surface 224 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 224 to implement analog circuits or digital circuits, such as DSP, ASIC, memory, or other signal processing circuit. Semiconductor die 220 may also contain IPDs, such as inductors, capacitors, and resistors, for RF signal processing. In one embodiment, semiconductor die 220 is a flipchip type semiconductor die.

An electrically conductive layer 226 is formed over active surface 224 using PVD, CVD, electrolytic plating, electroless plating process, or other suitable metal deposition process. Conductive layer 226 can be one or more layers of Al, Cu, Sn, Ni, Au, Ag, or other suitable electrically conductive material. Conductive layer 226 operates as contact pads electrically connected to the circuits on active surface 224.

An electrically conductive layer 228 is formed over conductive layer 226 using a patterning and metal deposition process such as sputtering, electrolytic plating, and electroless plating. Conductive layer 228 can be Al, Cu, Sn, Ni, Au, Ag, W, or other suitable electrically conductive material. Conductive layer 228 is a UBM electrically connected to conductive layer 226. UBMs 228 can be a multi-metal stack with adhesion layer, barrier layer, and seed or wetting layer. The adhesion layer is formed over conductive layer 226 and can be Ti, TiN, TiW, Al, or Cr. The barrier layer is formed over the adhesion layer and can be Ni, NiV, Pt, Pd, TiW, or CrCu. The barrier layer inhibits the diffusion of Cu into the active area of the die. The seed layer is formed over the barrier layer and can be Cu, Ni, NiV, Au, or Al. UBMs 228 provide a low resistive interconnect to conductive layer 226, as well as a barrier to solder diffusion and seed layer for solder wettability.

An electrically conductive bump material is deposited over conductive layer 228 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 228 using a suitable attachment or bonding process. In one embodiment, the bump material is reflowed by heating the material above its melting point to form balls or bumps 230. In some applications, bumps 230 are reflowed a second time to improve electrical contact to conductive layer 228. Bumps 230 can also be compression bonded or thermocompression bonded to conductive layer 228. Bumps 230 represent one type of interconnect structure that can be formed over conductive layer 228. The interconnect structure can also use stud bump, micro bump, or other electrical interconnect.

Figure 9B:
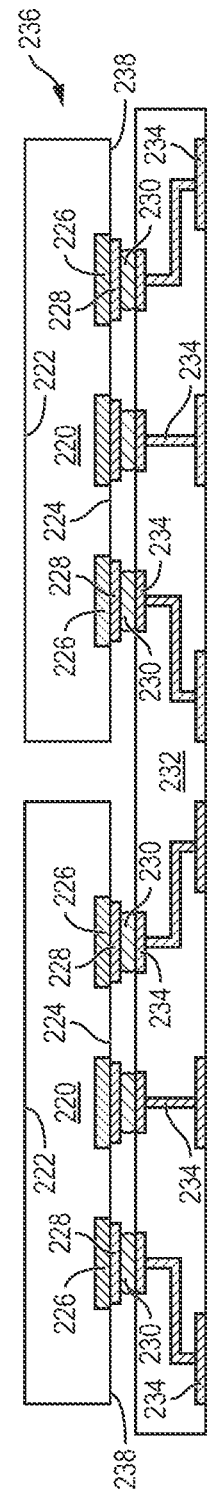

Semiconductor die 220 are mounted to substrate 232 using, for example, a pick and place operation with bumps 230 oriented toward the substrate. Substrate 232 includes conductive traces 234 for vertical and lateral interconnect through the substrate. FIG. 9b shows semiconductor die 220 mounted to substrate 232, as reconstituted wafer 236, with bumps 230 metallurgically and electrically bonded to conductive traces 234. Active surface 224 of semiconductor die 220 is held off or offset from substrate 232 by nature of bumps 230, i.e., there is a gap between portion 238 of active surface 224 and substrate 232. Substrate 232 can be a large round or rectangular panel (greater than 300 mm) with capacity for multiple semiconductor die 220.

Figure 9C:
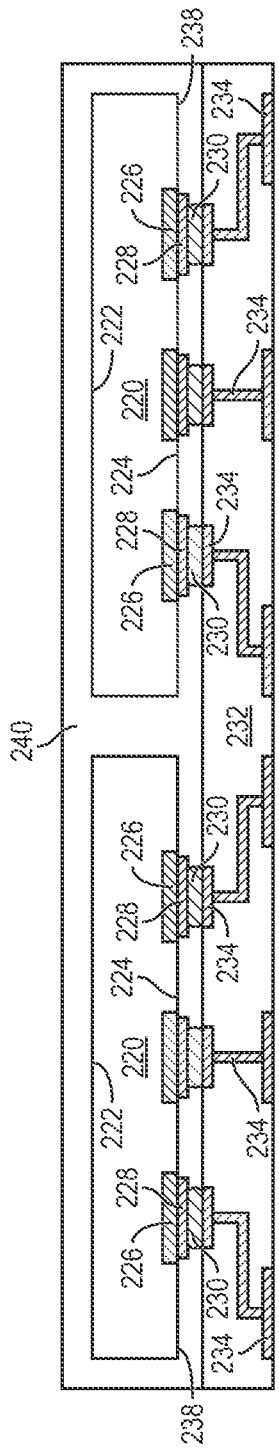

In FIG. 9c, a mold underfill (MUF) material 240 is deposited over semiconductor die 220 and substrate 232 using a paste printing, compressive molding, transfer molding, liquid encapsulant molding, vacuum lamination, spin coating, mold underfill, or other suitable application process. MUF material 240 can be polymer composite material, such as epoxy resin with filler, epoxy acrylate with filler, or polymer with proper filler. MUF material 240 is non-conductive and environmentally protects the semiconductor device from external elements and contaminants. In particular, MUF material 240 is disposed along the sides of semiconductor die 220 and in the gap between active surface 224 and substrate 232 and thus covers the sides of semiconductor die 220 and exposed portion 238 of active surface 224 along the surface edge of the semiconductor die.

Figure 9D:
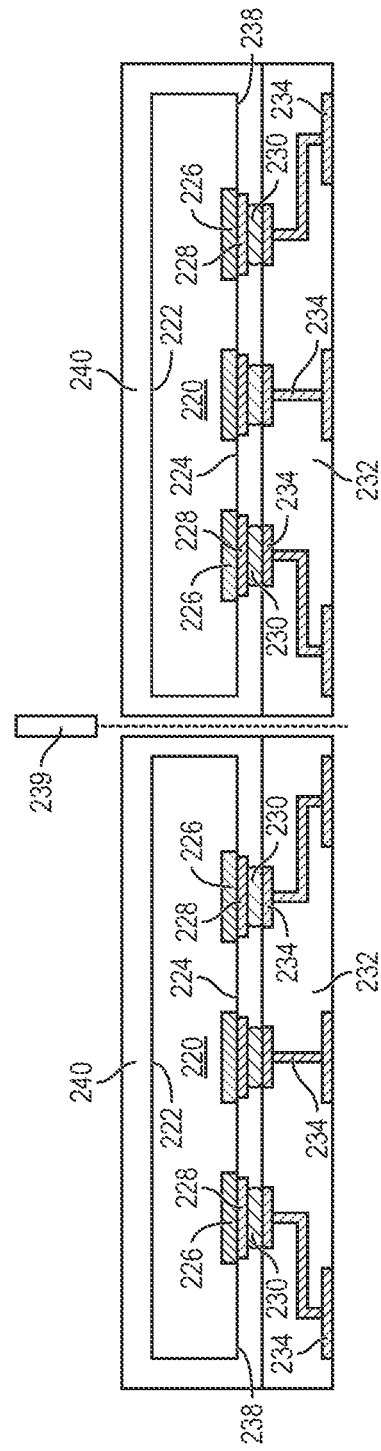

In FIG. 9d, semiconductor die 220 are singulated through MUF material 240 and substrate 232 with saw blade or laser cutting tool 239 to separate the semiconductor die and substrate units.

Figure 9E:
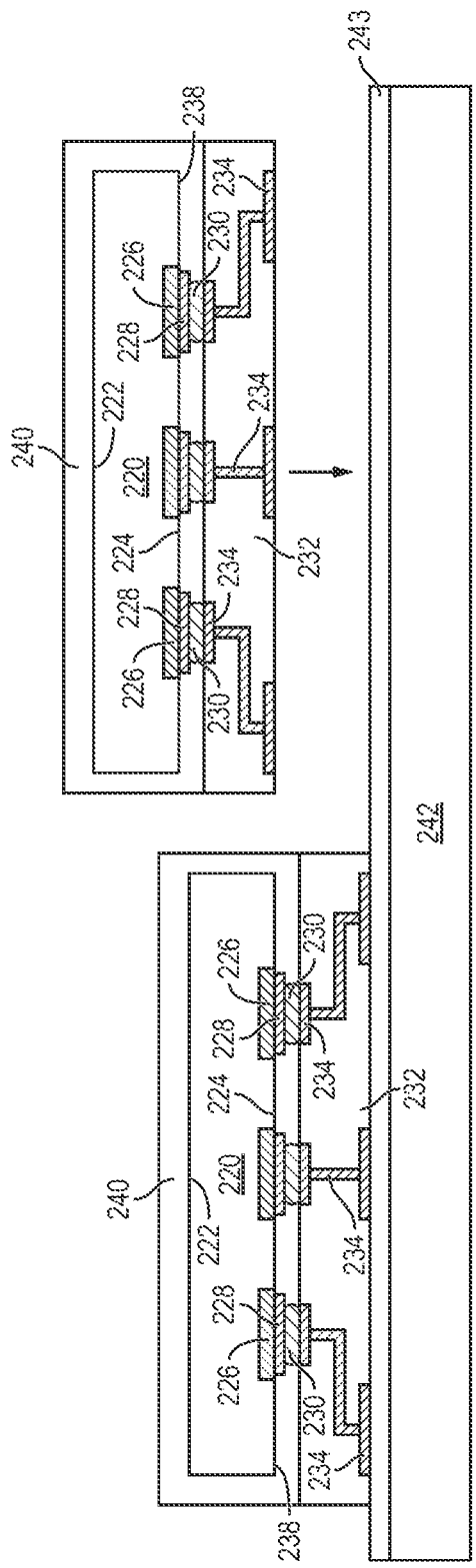

FIG. 9e shows a cross-sectional view of a portion of a carrier or temporary substrate 242 containing sacrificial base material such as silicon, polymer, beryllium oxide, glass, or other suitable low-cost, rigid material for structural support. An interface layer or double-sided tape 243 is formed over carrier 150 as a temporary adhesive bonding film, etch-stop layer, or thermal release layer. Carrier 242 can be a large round or rectangular panel (greater than 300 mm) with capacity for multiple semiconductor die 220 and substrate 232 units.

Figure 9F:
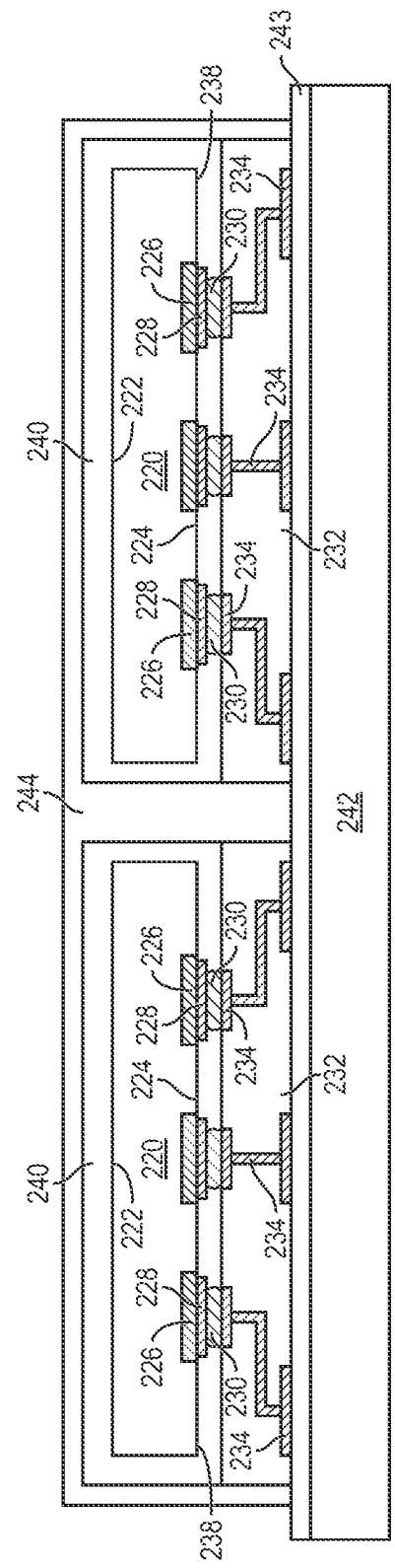

Semiconductor die 220 and substrate 232 units are mounted to carrier 242 and interface layer 243 using, for example, a pick and place operation with the substrate oriented toward the carrier. FIG. 9f shows semiconductor die 220 and substrate 232 units mounted to interface layer 243 of carrier 242.

An encapsulant or molding compound 244 is deposited over MUF material 240, substrate 232, and carrier 242 using a paste printing, compressive molding, transfer molding, liquid encapsulant molding, vacuum lamination, spin coating, or other suitable applicator. Encapsulant 244 can be polymer composite material, such as epoxy resin with filler, epoxy acrylate with filler, or polymer with proper filler. Encapsulant 244 is non-conductive and environmentally protects the semiconductor device from external elements and contaminants.

Figure 9G:
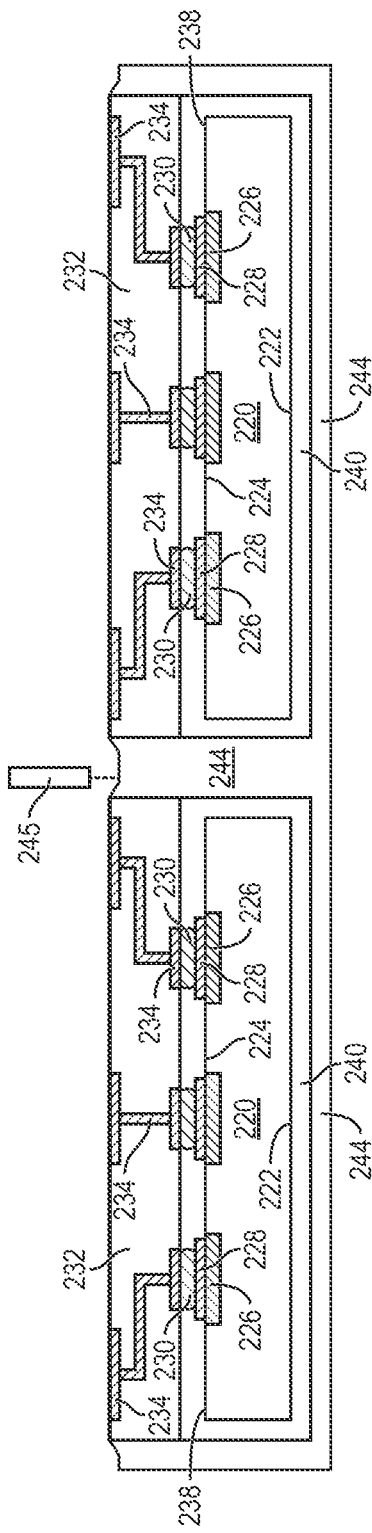

In FIG. 9g, carrier 242 and interface layer 243 are removed by chemical etching, mechanical peeling, CMP, mechanical grinding, thermal bake, UV light, laser scanning, or wet stripping to expose substrate 232 and encapsulant 244. A portion of encapsulant 244 is removed by LDA using laser 245. Alternatively, a portion of encapsulant 244 is removed by an etching process through a patterned photoresist layer.

Figure 9H:
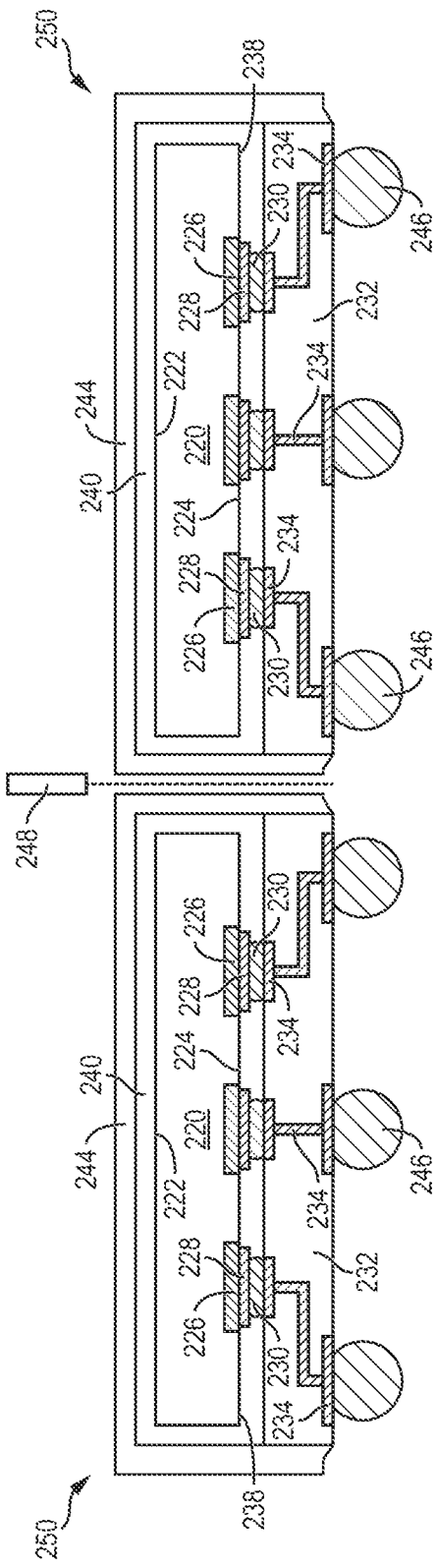

In FIG. 9h, an electrically conductive bump material is deposited over conductive layer 234 of substrate 232 opposite semiconductor die 220 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 234 using a suitable attachment or bonding process. In one embodiment, the bump material is reflowed by heating the material above its melting point to form balls or bumps 246. In some applications, bumps 246 are reflowed a second time to improve electrical contact to conductive layer 234. Bumps 246 can also be compression bonded or thermocompression bonded to conductive layer 234. Bumps 246 represent one type of interconnect structure that can be formed over conductive layer 234. The interconnect structure can also use bond wires, conductive paste, stud bump, micro bump, or other electrical interconnect.

Laser marking can be performed before or after bump formation, or after removal of carrier 242. The assembly undergoes plasma cleaning and flux printing.

Figure 10:
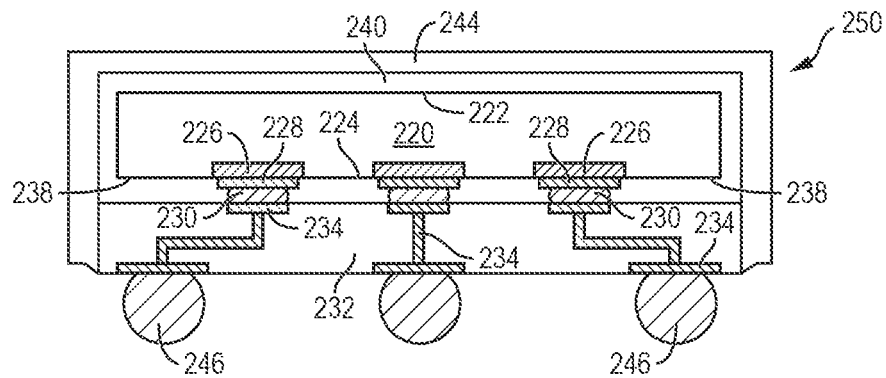
FIG. 10 illustrates the WLCSP with the sides and the portion of the active surface of the semiconductor die covered with the MUF material.

Semiconductor die 220 are singulated through encapsulant 244 with saw blade or laser cutting tool 248 into individual eWLB or WLCSP 250. FIG. 10 shows WLCSP 250 after singulation. In one embodiment, WLCSP 250 has dimensions of 3.0×2.6×0.7 millimeters mm with 0.4 mm pitch. Semiconductor die 220 is electrically connected to substrate 232 and bumps 246 for external interconnect. MUF material 240 covers the sides of semiconductor die 220 and portion 238 of active surface 224 to protect the sides and surface edge of the semiconductor die and increase manufacturing yield, particularly when surface mounting the semiconductor die. MUF material 240 also protects semiconductor die 220 from degradation due to exposure to light. WLCSP 250 undergoes electrical testing before or after singulation.

Figure 11:
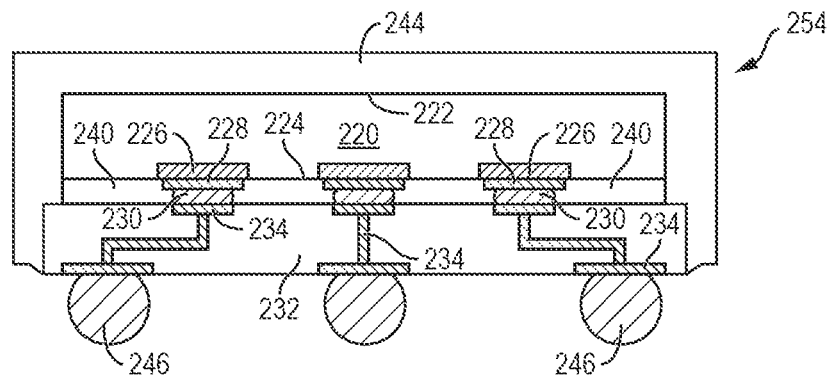
FIG. 11 illustrates the MUF material disposed between the semiconductor die and substrate.

FIG. 11 illustrates an embodiment of WLCSP 254, similar to FIG. 10, with MUF material 240 disposed under semiconductor die 220 and encapsulant 244 covering the side surfaces of the semiconductor die.

Figure 12:
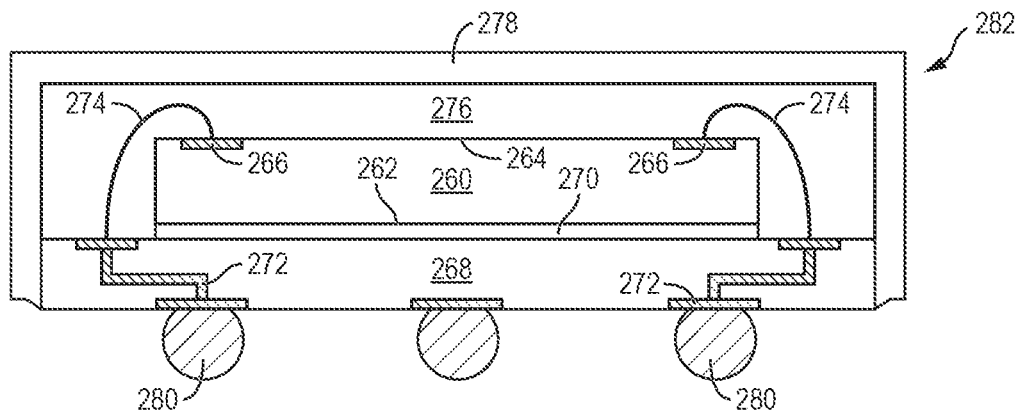
FIG. 12 illustrates another WLCSP with the sides and the portion of the active surface of the semiconductor die covered with the MUF material.

FIG. 12 illustrates another embodiment including semiconductor die 260, from a semiconductor wafer similar to FIG. 3a, having a back surface 262 and active surface 264 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 264 to implement analog circuits or digital circuits, such as DSP, ASIC, memory, or other signal processing circuit. Semiconductor die 260 may also contain IPDs, such as inductors, capacitors, and resistors, for RF signal processing. In one embodiment, semiconductor die 260 is a wire bond type semiconductor die.

An electrically conductive layer 266 is formed over active surface 264 using PVD, CVD, electrolytic plating, electroless plating process, or other suitable metal deposition process. Conductive layer 266 can be one or more layers of Al, Cu, Sn, Ni, Au, Ag, or other suitable electrically conductive material. Conductive layer 266 operates as contact pads electrically connected to the circuits on active surface 264.

Semiconductor die 260 is mounted to substrate 268 with die attach adhesive 270, such as epoxy resin, similar to FIGS. 9a-9b. Substrate 268 includes conductive traces 272 for vertical and lateral interconnect through the substrate. Bond wires 274 are formed between conductive layer 266 of semiconductor die 260 and conductive traces 272 on substrate 268. Substrate 268 can be a large round or rectangular panel (greater than 300 mm) with capacity for multiple semiconductor die 260.

An encapsulant or molding compound 276 is deposited over semiconductor die 260 and substrate 268 using a paste printing, compressive molding, transfer molding, liquid encapsulant molding, vacuum lamination, spin coating, or other suitable applicator, similar to FIG. 9c. Encapsulant 276 can be polymer composite material, such as epoxy resin with filler, epoxy acrylate with filler, or polymer with proper filler. Encapsulant 276 is non-conductive and environmentally protects the semiconductor device from external elements and contaminants.

Semiconductor die 260 are singulated through encapsulant 276 and substrate 268, similar to FIG. 9d. The singulated semiconductor die 260 and substrate 268 are mounted to a carrier, similar to FIG. 9e. An encapsulant or molding compound 278 is deposited over encapsulant 276 and substrate 268 using a paste printing, compressive molding, transfer molding, liquid encapsulant molding, vacuum lamination, spin coating, or other suitable applicator, similar to FIG. 9f. Encapsulant 278 can be polymer composite material, such as epoxy resin with filler, epoxy acrylate with filler, or polymer with proper filler. Encapsulant 278 is non-conductive and environmentally protects the semiconductor device from external elements and contaminants. The carrier is removed.

An electrically conductive bump material is deposited over conductive layer 272 of substrate 268 opposite semiconductor die 260 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 272 using a suitable attachment or bonding process. In one embodiment, the bump material is reflowed by heating the material above its melting point to form balls or bumps 280. In some applications, bumps 280 are reflowed a second time to improve electrical contact to conductive layer 272. Bumps 280 can also be compression bonded or thermocompression bonded to conductive layer 272. Bumps 280 represent one type of interconnect structure that can be formed over conductive layer 272. The interconnect structure can also use bond wires, conductive paste, stud bump, micro bump, or other electrical interconnect.

Laser marking can be performed before or after bump formation, or after removal of the carrier. The assembly undergoes plasma cleaning and flux printing.

Semiconductor die 260 are singulated through encapsulant 244 into individual eWLB or WLCSP 282 having dimensions of 3.0×2.6×0.7 millimeters mm with 0.4 mm pitch. Semiconductor die 260 is electrically connected to substrate 268 and bumps 280 for external interconnect. Encapsulant 276 covers the side surfaces of semiconductor die 260 to protect the surface edge of the semiconductor die and increase manufacturing yield, particularly when surface mounting the semiconductor die.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   forming a first insulating layer over the semiconductor die;
   forming a redistribution layer over the semiconductor die and first insulating layer;
   forming a second insulating layer over the redistribution layer;
   forming an under-bump metallization layer in an opening of the first insulating layer and the second insulating layer; and
   depositing an encapsulant over the semiconductor die and the redistribution layer after forming the redistribution layer and the second insulating layer.

2. The method of claim 1, further including depositing the encapsulant over a side surface of the semiconductor die.

3. The method of claim 1, further including depositing the encapsulant over a back surface of the semiconductor die.

4. The method of claim 1, further including disposing a solder bump on the under-bump metallization after depositing the encapsulant.

5. The method of claim 1, further including:
   disposing the semiconductor die on a carrier with the redistribution layer oriented toward the carrier; and
   depositing the encapsulant over the semiconductor die and carrier.

6. The method of claim 1, further including singulating through the encapsulant to form a wafer-level chip scale package including the semiconductor die.

7. A method of making a semiconductor device, comprising:
   providing a semiconductor die;
   forming a redistribution layer over the semiconductor die;
   forming an under-bump metallization over the semiconductor die and connected to the redistribution layer;
   forming an insulating layer over the redistribution layer;
   forming an opening in the insulating layer, wherein the opening and the under-bump metallization are aligned; and
   depositing an encapsulant over the semiconductor die, the insulating layer, and the redistribution layer.

8. The method of claim 7, further including depositing the encapsulant over a side surface of the semiconductor die.

9. The method of claim 7, further including depositing the encapsulant over a back surface of the semiconductor die.

10. The method of claim 7, further including disposing a solder bump on the under-bump metallization after depositing the encapsulant.

11. The method of claim 7, further including:
    disposing the semiconductor die on a carrier with the redistribution layer oriented toward the carrier; and
    depositing the encapsulant over the semiconductor die and carrier.

12. The method of claim 7, further including singulating through the encapsulant to form a wafer-level chip scale package including the semiconductor die.

13. A method of making a semiconductor device, comprising:
    providing a semiconductor die;
    forming a redistribution layer over the semiconductor die;
    forming an under-bump metallization over the redistribution layer;
    depositing an encapsulant over the semiconductor die and the redistribution layer after forming the redistribution layer and the under-bump metallization; and
    disposing a solder bump on the under-bump metallization.

14. The method of claim 13, further including depositing the encapsulant over a side surface of the semiconductor die.

15. The method of claim 13, further including depositing the encapsulant over a back surface of the semiconductor die.

16. The method of claim 13, further including:
    disposing the semiconductor die on a carrier with the redistribution layer oriented toward the carrier; and
    depositing the encapsulant over the semiconductor die and carrier.

17. The method of claim 13, further including singulating through the encapsulant to form a wafer-level chip scale package including the semiconductor die.

18. A method of making a semiconductor device, comprising:
provide a semiconductor die;
forming a redistribution layer over the semiconductor die;
forming an under-bump metallization over the redistribution layer; and
depositing an encapsulant over the semiconductor die and the redistribution layer after forming the redistribution layer and the under-bump metallization.

19. The method of claim 18, further including depositing the encapsulant over a side surface of the semiconductor die.

20. The method of claim 18, further including depositing the encapsulant over a back surface of the semiconductor die.

21. The method of claim 18, further including:
disposing the semiconductor die on a carrier with the redistribution layer oriented toward the carrier; and
depositing the encapsulant over the semiconductor die and carrier.

22. The method of claim 18, further including singulating through the encapsulant to form a wafer-level chip scale package including the semiconductor die.

\* \* \* \* \*